United States Patent
Vyas et al.

(10) Patent No.: US 10,628,065 B1
(45) Date of Patent: Apr. 21, 2020

(54) EDGE DETECTION FOR MEMORY CONTROLLER

(71) Applicant: Xilinx, Inc., San Jose, CA (US)

(72) Inventors: Amit Vyas, Hyderabad (IN); Ramakrishna R. Gaddam, Hyderabad (IN)

(73) Assignee: XILINX, INC., San Jose, CA (US)

(*) Notice: Subject to any disclaimer, the term of this patent is extended or adjusted under 35 U.S.C. 154(b) by 16 days.

(21) Appl. No.: 16/004,662

(22) Filed: Jun. 11, 2018

(51) Int. Cl.
*G11C 8/18* (2006.01)
*G06F 3/06* (2006.01)

(52) U.S. Cl.
CPC .......... *G06F 3/0634* (2013.01); *G06F 3/0605* (2013.01); *G06F 3/0673* (2013.01)

(58) Field of Classification Search
CPC ..................................................... G11C 29/38
USPC ........................................................ 714/718
See application file for complete search history.

(56) References Cited

U.S. PATENT DOCUMENTS

| | | | |
|---|---|---|---|
| 7,073,100 B2* | 7/2006 | Chadwick | G11C 29/12015 714/718 |
| 7,278,078 B2* | 10/2007 | Hii | G01R 31/30 365/201 |
| 7,480,197 B2 | 1/2009 | Carnevale et al. | |
| 8,737,161 B1 | 5/2014 | Kumar et al. | |
| 2007/0260947 A1* | 11/2007 | Hou | G01R 29/26 714/718 |
| 2010/0202223 A1* | 8/2010 | Kuroki | G11C 7/1006 365/193 |
| 2011/0258475 A1* | 10/2011 | Lee | G06F 13/1689 713/401 |
| 2014/0126310 A1 | 5/2014 | Sheen et al. | |
| 2017/0162276 A1* | 6/2017 | Ok | G11C 29/38 |

OTHER PUBLICATIONS

Plessas, F., et al., "Advanced calibration techniques for high-speed source-synchronous interfaces", IET Computers & Digital Techniques, 2011, vol. 5, Issues 5, pp. 366-374.
Xilinx, Inc., UltraScale Architecture-Based FPGAs Memory IP v1.4, LogiCORE IP Product Guide, PG150 Apr. 4, 2018, pp. 1-805, available at https://www.xilinx.com/support/documentation/ip_documentation/ultrascale_memory_ip/v1_4/pg150-ultrascale-memory-ip.pdf.

* cited by examiner

*Primary Examiner* — Min Huang
(74) *Attorney, Agent, or Firm* — Patterson + Sheridan, LLP

(57) ABSTRACT

Some examples of the present disclosure generally relate to integrated circuits that include hardware logic for detecting an edge of a signal. In some examples, an integrated circuit includes a traffic generator, a memory communication path, a comparator, and edge detection hardware logic. The traffic generator, comparator, and edge detection hardware logic are configurable based on a calibration stage. The traffic generator is operable to generate commands to memory via a memory communication path. The comparator is operable to compare data from the memory communication path with known data and to responsively output a comparison status. The data from the memory communication path is in response to the commands generated by the traffic generator. The edge detection hardware logic is operable to detect an edge of a signal based on the comparison status.

20 Claims, 6 Drawing Sheets

EDGE DETECTION FOR MEMORY CONTROLLER

TECHNICAL FIELD

Examples of the present disclosure generally relate to edge detection of a signal and, in particular, to edge detection for calibration of a memory controller.

BACKGROUND

Synchronous memory technologies implement memory reads and writes based on clock signals. Skew of various signals can result in data stored in memory and read from memory having poor integrity. For example, data that is stored or read can be invalid when sampled at incorrect timing. Skew can result from different loading of the signals. Different impedances of different physical paths for signals, which can be caused by differences in physical path lengths, for example, can result in different delays for the signals. The delays in the signals can cause the skew that can result in invalid data being sampled. Effects of skew can become more pronounced at higher frequency sampling rates. To address skew, synchronous memory technologies can implement calibration processes to offset effects of skew.

SUMMARY

Some examples of the present disclosure generally relate to integrated circuits that include hardware logic for detecting an edge of a signal. Various examples can permit offloading simple, repetitive operations from a process to the hardware logic to increase edge detection speed.

An example of the present disclosure is an integrated circuit. The integrated circuit includes a traffic generator, a memory communication path, a comparator, and edge detection hardware logic. The traffic generator is configurable based on a calibration stage. The memory communication path is communicatively coupled to the traffic generator. The memory communication path is further configured to be communicatively coupled to memory. The traffic generator is operable to generate commands to the memory via the memory communication path. The comparator is communicatively coupled to the memory communication path. The comparator is configurable based on the calibration stage. The comparator is operable to compare data from the memory communication path with known data and to responsively output a comparison status. The data from the memory communication path is in response to the commands generated by the traffic generator. The edge detection hardware logic is communicatively coupled to the traffic generator and the comparator. The edge detection hardware logic is configurable based on the calibration stage. The edge detection hardware logic is operable to detect an edge of a signal based on the comparison status.

Another example of the present disclosure is a method of operating an integrated circuit. A traffic generator is triggered by edge detection hardware logic to generate traffic to memory through a memory communication path. A response from the memory is compared by a comparator to an expected pattern. The response from the memory is based on the traffic. An edge in a signal is detected by the edge detection hardware logic based on comparing the response to the expected pattern.

Yet another example of the present disclosure is a method of operating an integrated circuit. Using a processor, a traffic generator, a comparator, an edge detection master hardware unit, and an edge detection slave hardware unit are configured based on a calibration stage. By the edge detection master hardware unit, the traffic generator is triggered to generate traffic to memory through a memory communication path. Generating the traffic is based on the calibration stage, and generating the traffic includes reading a response from the memory through the memory communication path. By the comparator, the response is compared to an expected pattern to generate a comparison status. Comparing the response to the expected pattern is based on the calibration stage. By the edge detection slave hardware unit, a detection status is generated based on detection of an edge of a signal based on the comparison status. Detection of the edge is based on the calibration stage. By the edge detection master hardware unit, an interrupt signal is transmitted to the processor when the detection status indicates the edge has been detected, and a value of a delay register is altered when the detection status indicates the edge has not been detected. A delay of a signal path in the memory communication path is configurable based on the value of the delay register.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only example implementations and are therefore not to be considered limiting of the scope of other implementations.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
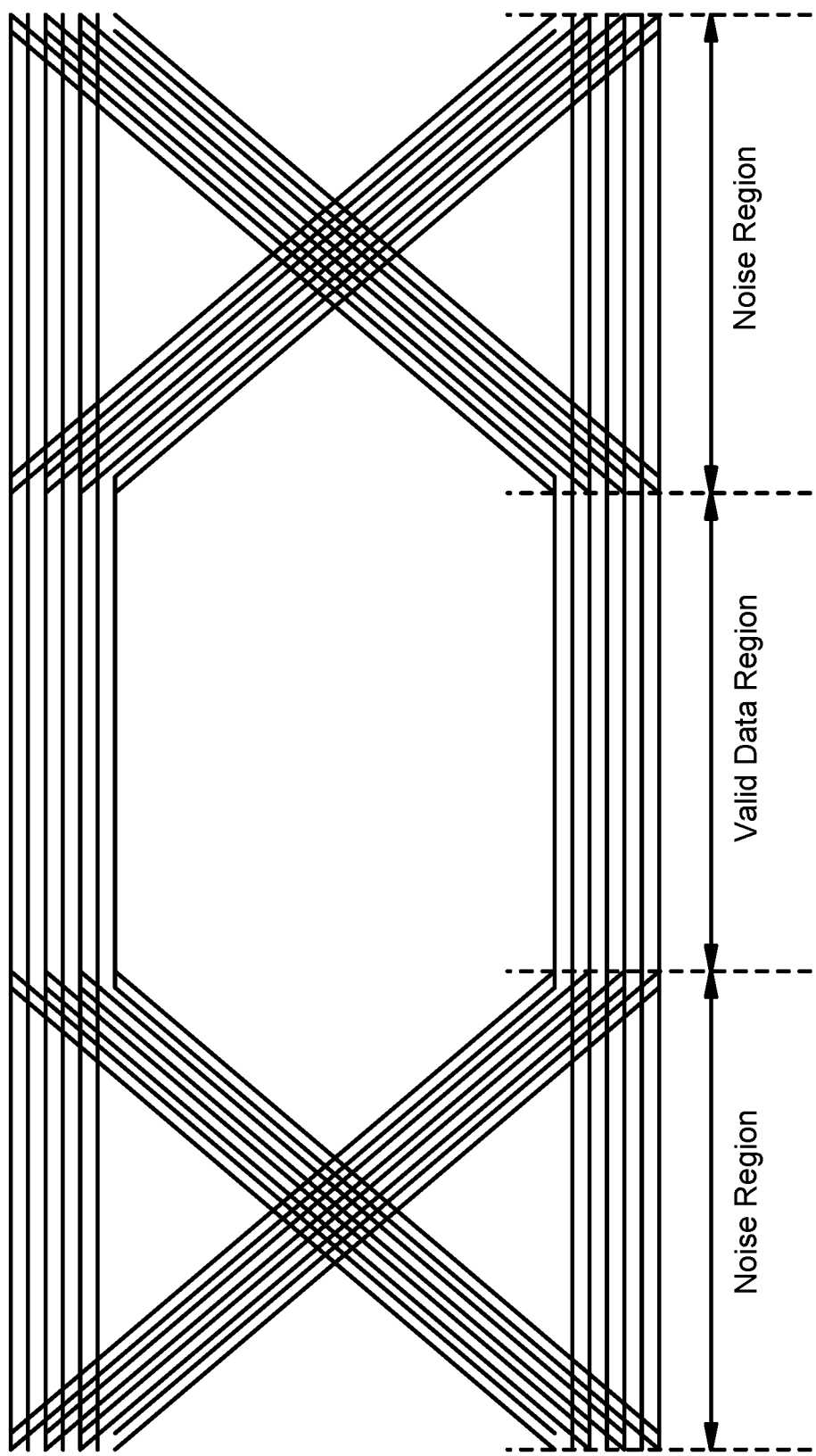
FIG. 1 is an example signal profile to show noise regions and a valid data region, in accordance with some examples of the present disclosure.

Some examples of the present disclosure provide integrated circuits that provide hardware logic for detecting an edge of a signal. In some examples described herein, the edge detection is used during calibrating a data, command, and/or address path (generically hereinafter "DCA path") to a memory device. The edge detection hardware logic can be generic to the calibration stage that implements the edge detection. The hardware logic can be configurable to be selectively configured based on the calibration stage. The hardware logic that detects the edge can be separate from a processor, and can detect an edge in less time than a processor. By implementing such hardware logic separate from the processor, interactions between the processor and the memory physical interface (e.g., PHY) configuration block can be reduced. This can reduce the load on the processor of performing repetitive, sequential, and simple data processing, while maintaining the processor to perform more complex processing. Further, by implementing such hardware logic separate from the processor, parallel processing on data may be implemented, which can further decrease the time for the calibration process. Also, in some examples, the integrated circuit can include a selector that is capable of bypassing the hardware logic, which can permit a processor to implement software-based processing of signals to detect an edge.

In further examples, whether performed by a processor and/or hardware logic, some operations in methods for edge detection can be performed in parallel for multiple bits of a signal. For example, traffic can be generated, samples can be obtained, comparisons made, and delay taps incremented for multiple bits in parallel. By performing some operations for multiple bits in parallel, a processing time can be reduced. Further, simulation time for designing such a processor and/or hardware logic can be reduced.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of different embodiments or as a limitation on the scope of the claims. In addition, an illustrated example need not have all the aspects or advantages shown. An aspect or an advantage described in conjunction with a particular example is not necessarily limited to that example and can be practiced in any other examples, even if not so illustrated or if not so explicitly described.

Various examples are described below in the context of edge detection for calibration for a memory controller to synchronous dynamic random access memory (SDRAM). However, various examples and/or aspects described herein can be implemented in any module that implements edge detection, regardless of memory device (if implemented with respect to memory) and/or data type or format. For example, the hardware logic described herein can be implemented in any synchronous memory controller for any memory device.

In the context of SDRAM, the DCA paths over which the memory controller communicates with the memory device are calibrated to help ensure valid communications, including valid reads from and writes to the memory. Many different stages may be implemented in the calibration process. For example, the calibration process can include a data strobe (DQS) gate calibration, write leveling, read DQS centering (simple), read training, read DQS centering, etc. Many of the calibration stages attempt to center align a rising or falling edge of a sampling clock with the eye of the data signal. Generally, to do this, edges of various signals are detected by incrementally delaying the sampling clock and/or the data signal until the edges are detected. Each edge can be thought of as a separation point between a noise region and a valid data region. FIG. 1 illustrates an example signal profile to show noise regions and a valid data region. The noise region is generally a region where unexpected data is sampled from the data signal by the sampling clock (e.g., due to a transition in the data signal), and the valid data region is generally a region where expected data is sampled from the data signal by the sampling clock. Once the edges are detected, a center of the eye of the data signal can be determined, and the sampling clock can be delayed to align with the center of the eye of the data signal.

Generally, edge detection includes (i) generating traffic to the memory, (ii) comparing the memory response to some known or expected pattern, and (iii) updating the delay of the DCA path and/or clock path based on the comparison. Generating traffic can include (i) writing a known pattern burst to the memory and reading what was actually written back (such as for a write DCA path calibration) and (ii) reading a pre-defined pattern from a mode register of the memory (such as for a read DCA path calibration). The comparing the memory response determines whether the data that was read from the memory during the generating traffic is noise or is valid data. If the calibration stage is for a read DCA path calibration, the comparison compares the data that was read to the known pattern that was expected to be read. If the calibration stage is for a write DCA path calibration, the comparison compares the data that was read to the pattern burst that was written. The DCA path and/or clock path can then be delayed based on the result of the comparison.

In delaying one or more paths, calibration logic can be configured in one of a plurality of modes. In a first mode, the calibration logic can be configured to determine a transition from a noise region to a valid region. In a second mode, the calibration logic can be configured to determine a transition from a valid region to a noise region. Depending on the mode, the calibration logic can incrementally increase or decrease delay of one or more paths until a pre-defined condition of the comparison occurs. For example, if the calibration logic is configured to determine a transition from a valid region to a noise region, the calibration can continue increasing or decreasing delay while the result of the comparison indicates the sampled data is in a valid region and until the result of the comparison indicates that the sample data has transitioned into a noise region. As another example, if the calibration logic is configured to determine a transition from a noise region to a valid region, the calibration can continue increasing or decreasing delay while the result of the comparison indicates the sampled data is in a noise region and until the result of the comparison indicates that the sample data has transitioned into a valid region. In some scenarios, the increase or decrease in delay may saturate the delay taps without the appropriate condition being achieved, at which point an error condition occurs.

Figure 2:
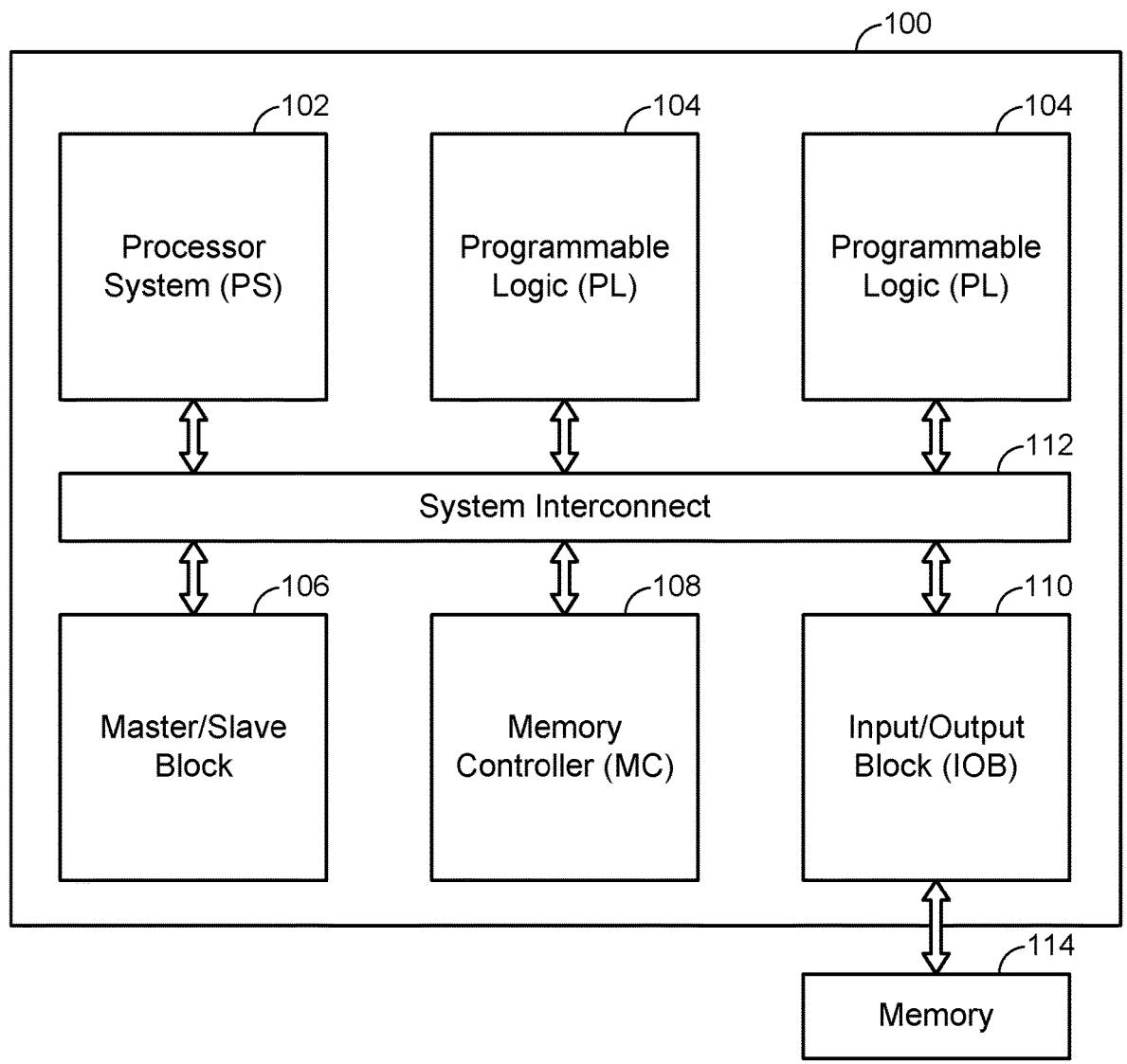
FIG. 2 is a block diagram of an integrated circuit (IC), in accordance with some examples of the present disclosure.

FIG. 2 is a block diagram of an integrated circuit (IC) 100, in accordance with some examples of the present disclosure. In some examples, the IC 100 may be a programmable IC, such as a field programmable gate array (FPGA), a programmable logic device (PLD), and the like. In other examples, the IC 100 may be an application specific IC (ASIC) or another IC. The IC 100 may be a system-on-chip (SoC) and may be implemented on a single die. The IC 100 is described herein to illustrate certain aspects that may be implemented in some examples; although in other examples, such aspects may be omitted.

In the illustrated example, the IC 100 includes a processing system (PS) 102, programmable logic (PL) 104, a master and/or slave block 106, a memory controller (MC) 108, an input/output block (IOB) interface 110, and a system interconnect 112. These blocks and subsystems are examples. The IC 100 can include any combination of these, additional, and/or different blocks and subsystems.

The PS 102 can be or include one or more processor cores. For example, the PS 102 can include a number of ARMbased embedded processor cores. The PL 104 can include any number of configurable logic blocks (CLBs), which may be programmed or configured using the PS 102. The master/slave block 106 may be any of a number of blocks and subsystems. For example, the master/slave block 106 may be programmable logic, a processing system (such as a digital signal processor (DSP), graphical processor unit (GPU), or the like), a video compression unit (VCU), an accelerator, memory, or other blocks and/or subsystems. The MC 108 is a memory controller that is configured to control access to memory by a master module, such as the PS 102, PL 104, or another module. In some examples, the MC 108 can be a double data rate fourth-generation (DDR4) MC, a high bandwidth memory second-generation (HBM2) MC, or another MC. In other examples, the MC 108 can be any generation technology and/or any standard or non-standard MC. In a specific example, the MC 108 is a DDR4 MC. The 10B 110 can be configured to permit communication between the IC 100 and another component off-chip. The 10B 110 can be configured for any standard and/or proprietary communications. The PS 102, PL 104, master/slave block 106, MC 108, and 10B 110 are communicatively coupled to the system interconnect 112. Additionally and/or alternatively, any of the PS 102, PL 104, master/slave block 106, MC 108, and 10B 110 may be communicatively coupled together without the system interconnect 112 intervening. The system interconnect 112 can include a number of communication networks or interconnects. For example, the system interconnect 112 can include a Network-on-Chip (NoC) through which the various modules can communicate, e.g., application data during operation of the IC 100. The system interconnect 112 can further include, for example, a peripheral interconnect, such as a NoC peripheral interconnect when a NoC is implemented to configure various components of the NoC and/or other modules. The system interconnect 112 can also include a configuration interconnect through which the PS 102 can configure the PL 104, for example.

As illustrated, the 10B 110 is communicatively coupled to off-chip memory 114. The off-chip memory 114 can be or include, for example, dynamic random access memory (DRAM), flash memory, or other memory. The off-chip memory 114 can be attached to a same interposer, package substrate, or printed circuit board (PCB) as the IC 100, which interposer, package substrate, or PCB can communicatively couple the off-chip memory 114 to the IC 100, for example. Additional and/or different components may be coupled to the IC 100 using the 10B 110. Various modules on the IC 100 may be communicatively coupled to various components off-chip from the IC 100 via the 10B 110, and further, possibly via the system interconnect 112.

Figure 3:
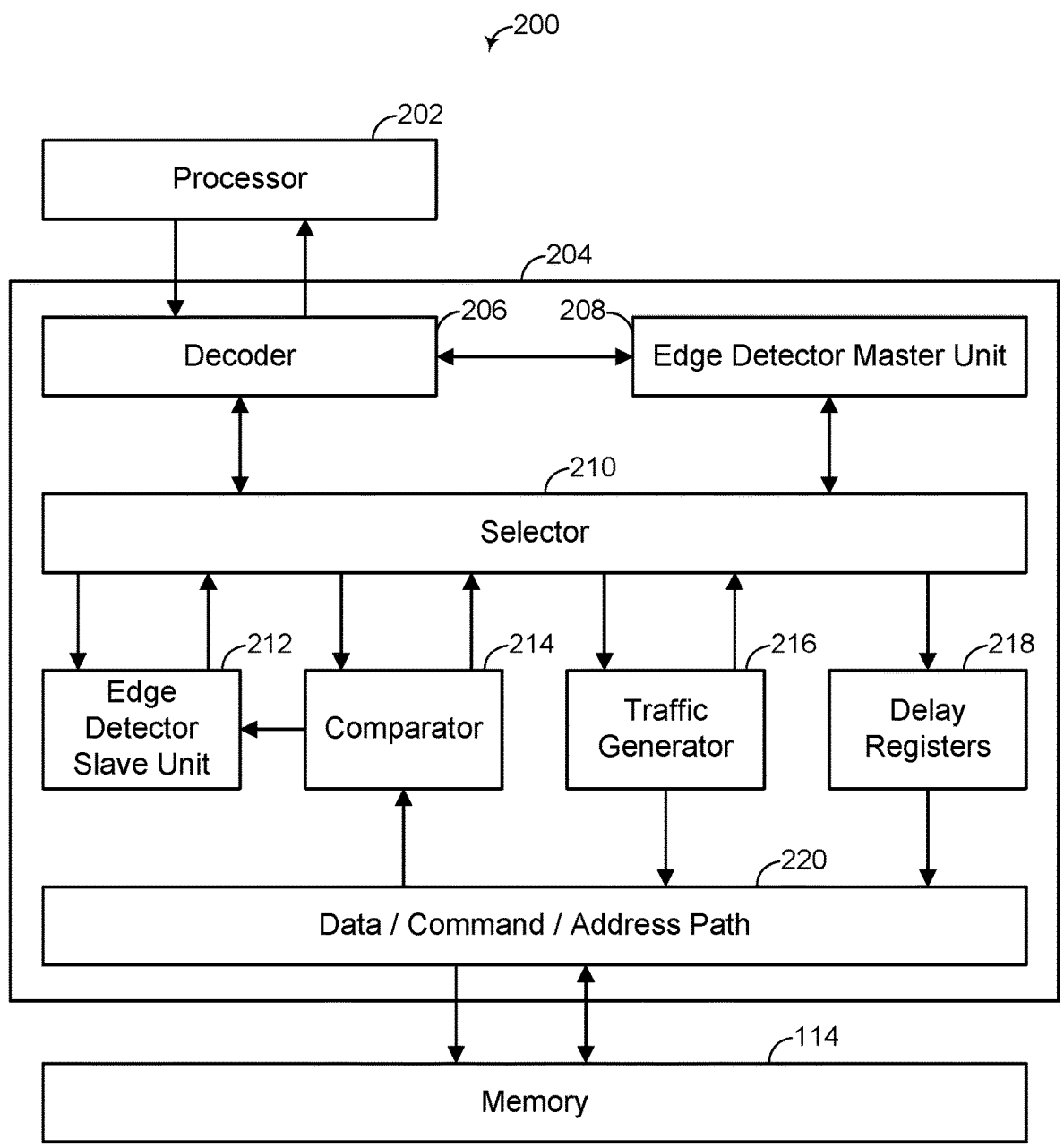
FIG. 3 is a block diagram of a portion of an IC, in accordance with some examples of the present disclosure.

FIG. 3 is a block diagram of a portion of an IC 200, in accordance with some examples of the present disclosure. The IC 200 includes a processor 202 and a memory controller 204 communicatively coupled to the processor 202. The memory controller 204 is communicatively coupled to memory 114. The block diagram of the portion of the IC 200 of FIG. 3 can be implemented in the context of the IC 100 of FIG. 2. For example, the processor 202 can be a core of the PS 102 or a soft processor core instantiated in the PL 104 (such as the MicroBlaze soft processor core available from Xilinx, Inc.). The memory controller 204 can be a hardened memory controller like the MC 108, can be logic instantiated in the PL 104, and/or can have some components that are hardened while other components are logic instantiated in the PL 104. Although not illustrated, the memory controller 204 is communicatively coupled to memory 114 via the 10B 110, and possibly further, via the system interconnect 112.

In some examples, the memory controller 204 includes hardware logic capable of detecting edges of various signals. Further, the memory controller 204 can include hardware logic that selectively bypasses some of the hardware logic used to detect edges. During operation in some examples, the memory controller 204 detects an edge, and a response signal relating to the detected edge is communicated to the processor 202 from the memory controller 204. The processor 202 then determines an eye of a signal for calibration based on the response signal from the memory controller 204. During operation in other examples, status/response information is communicated to the processor 202 from the memory controller 204, without the memory controller 204 detecting an edge. The processor 202 processes the status/response information to detect an edge and determines an eye of a signal for calibration.

The memory controller 204 includes a decoder 206, an edge detection master unit (EDM) 208, a selector 210, an edge detection slave unit (EDS) 212, a comparator 214, a traffic generator 216, delay registers 218, and a data/command/address (DCA) path 220. The processor 202 communicates control commands and configuration data to the decoder 206. The decoder 206 is operable to decode the commands and configuration data and transmit data to other components within the memory controller 204. The decoder 206 is further operable to receive data or information from various components within the memory controller 204 and to format and communicate the data or information to the processor 202.

During operation, the processor 202 transmits a mode command to the decoder 206. The mode command indicates whether the memory controller 204 or processor 202 is to detect an edge of a signal during the operation. The decoder 206 is operable to decode the mode command and responsively transmit a select signal to the selector 210. The selector 210 can be or include one or more multiplexers or other combinational logic that is capable of selectively (i) bypassing the EDM 208 and EDS 212 when the select signal corresponds to the mode command indicating that the processor 202 is to detect an edge, and (ii) routing signals to, and enabling, the EDM 208 and EDS 212 when the select signal corresponds to the mode command indicating that the memory controller 204 is to detect an edge.

When the EDM 208 and EDS 212 are bypassed, the processor 202 transmits control commands and configuration data to the decoder 206, which decodes the control commands and configuration data and transmits the resulting decoded data through the selector 210 to a respective component, such as the comparator, traffic generator 216, and/or delay registers 218. When the EDM 208 and EDS 212 are enabled, the processor 202 transmits control commands and configuration data to the decoder 206, which decodes the control commands and configuration data and transmits the decoded data to the EDM 208 or other component, such as described below.

Figure 4:
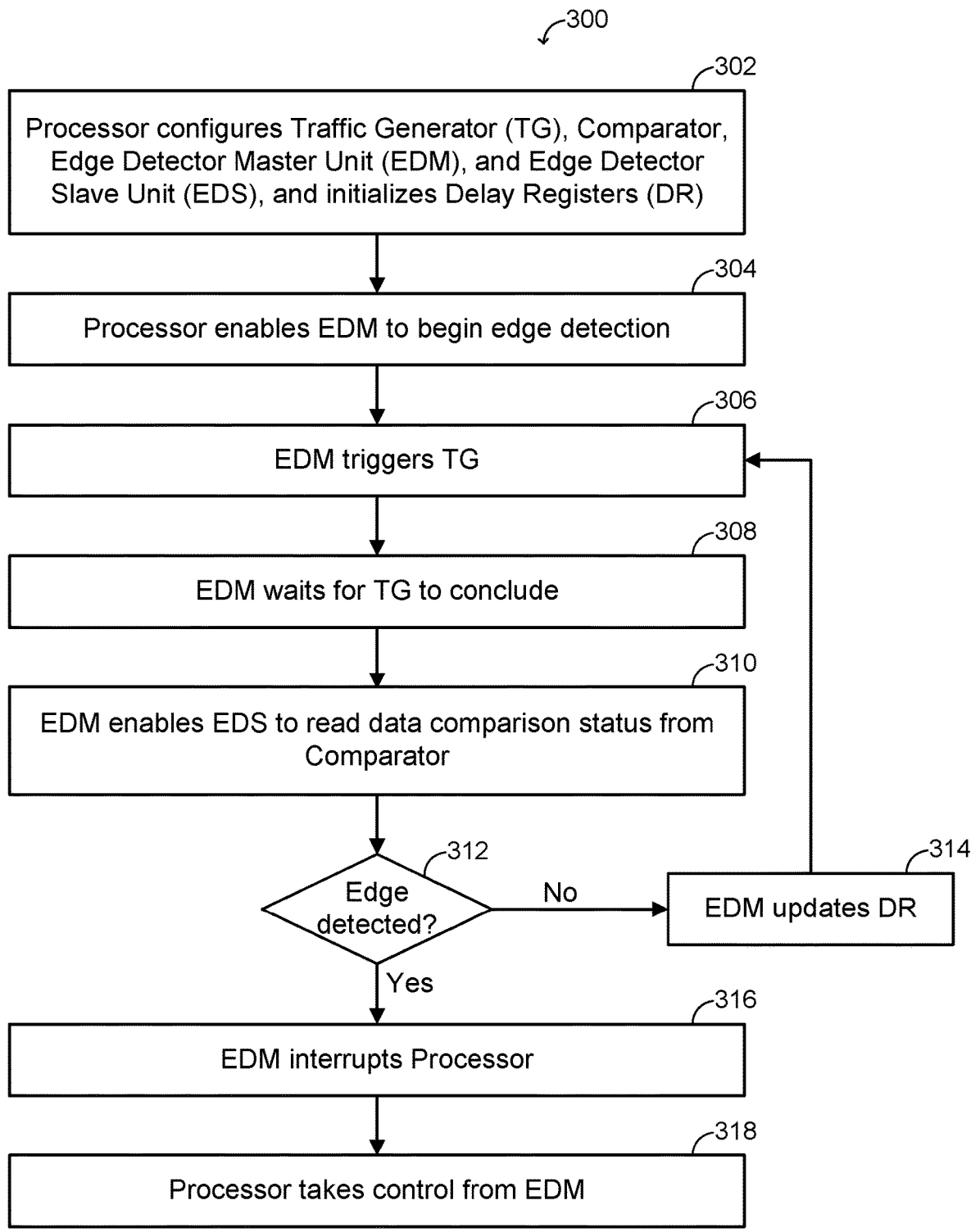
FIG. 4 is a method for detecting an edge of a signal, in accordance with some examples of the present disclosure.

The following description is during operation when the EDM 208 and EDS 212 are enabled. During this operation, communications between the EDM 208 and any of the EDS 212, comparator 214, traffic generator 216, and delay registers 218 is via the selector 210. This operation is further described in the context of the method 300 of FIG. 4.

In operation 302, the processor 202, via the decoder 206, configures the traffic generator 216, comparator 214, EDM 208, and EDS 212, and initializes the delay registers 218. The configuration of the traffic generator 216, comparator 214, EDM 208, and EDS 212 is based on the calibration stage that implements the edge detection. The traffic generator 216 is configurable based on the calibration stage, which can determine the type of commands and data that the traffic generator 216 implements to generate traffic. The traffic generator 216 can further be configured to generate traffic (e.g., read and write commands) in various modes and/or patterns. The comparator 214 is configurable based on the calibration stage, which can determine which signals the comparator 214 is to compare (e.g., multiple bits of a memory response or a single bit of the memory response) and can determine what the expected pattern is for comparison. The EDS 212 is configurable based on the calibration stage, which can determine what value or pattern of a comparison status received from the comparator 214 is for identifying an edge by the EDS 212. The EDS 212 is further configurable based on the region mode that is to be detected (e.g., valid region, noise region, valid-to-noise transition, and/or noise-to-valid transition). The EDM 208 is configurable based on the calibration stage, which can determine which delay taps are to be altered by the EDM 208 in the delay registers 218. The EDM 208 can act as a sequencer when enabled. The calibration stage can also determine which delays in the delay registers 218 to initialize and to what values (e.g., indicating no delay initially).

In operation 304, the processor 202, via the decoder 206, enables the EDM 208 to begin edge detection. The edge detection is thereafter under the control of the EDM 208. In operation 306, the EDM 208 triggers the traffic generator 216 to begin generating traffic based on the calibration stage. The generated traffic is communicated from the traffic generator 216 to the DCA path 220 to read and/or write data to the memory 114. Commands (e.g., read and write commands) are communicated from the DCA path 220 to the memory 114 along with associated addresses that are to be read or written. Data is communicated between the DCA path 220 and memory 114, which is read from or written to the memory depending on the command. Data is read from memory 114 as part of the generated traffic. For example, in a read path calibration, data is read from mode registers in memory 114, and in a write path calibration, data that is written to memory during the traffic generation is read. In operation 308, the EDM 208 waits for the traffic generator 216 to conclude. The traffic generator 216 communicates a status signal to the EDM 208 that indicates whether the traffic generator 216 is continuing to generate traffic or has concluded.

Upon the traffic generator 216 communicating a status signal to the EDM 208 indicating that the traffic generator 216 has concluded generating traffic, in operation 310, the EDM 208 enables the EDS 212 to read a comparison status from the comparator 214. Data that is read from memory 114 based on the generated traffic is communicated from the DCA path 220 to the comparator 214, and the comparator 214 compares the data to an expected or known pattern based on the calibration stage. The comparator 214 can include bit slices for each bit of the response that was read from memory 114. A comparison status can be generated on a per-bit basis for multiple bits or can be generated based on a single bit comparison depending on the calibration stage. The comparison can be for each bit of the input/output interface between the DCA path 220 and the memory 114, for example. The comparison status is communicated from the comparator 214 to the EDS 212 based on the comparison. The comparator 214 can compare multiple bits of a signal to the various expected or known patterns in parallel.

In operation 312, based on the comparison status, the EDS 212 is capable of detecting an edge of a signal. For example, depending on the mode and/or calibration stage, a change in the comparison status or a pre-determined value of the comparison status can indicate an edge has occurred, and the EDS 212 is configured to detect, based on the comparison status, the edge and communicate that the edge has been detected. The EDS 212 can be configured to detect various edges or regions. The EDS 212 can be configured to detect windows for a signal based on the edges that are detected. The EDS 212 can be configured to detect a valid region in a signal, a noise region in a signal, a valid-to-noise transition edge in a signal, and/or a noise-to-valid transition edge in a signal.

A status of the EDS 212, which indicates whether an edge has been detected, is communicated to the EDM 208. In operation 314, if the status of the EDS 212 indicates that an edge has not been detected, the EDM updates one or more of the delay registers 218, which can alter one or more values stored in the delay registers 218 to, e.g., increment a delay of one or more signals in the DCA path 220. The values stored in the delay registers 218 are communicated to the DCA path 220, which controls various delays in signals based on the values. The EDM 208 can update the delay registers 218 with a coarse delay tuning and/or fine delay tuning. Thereafter, operations 306 through 312 are repeated until an edge is detected.

In operation 316, once an edge has been detected in operation 312, the EDM 208, via the decoder 206, interrupts the processor 202, and in operation 318, the processor 202 takes control from the EDM 208. The EDM 208 transmits status and response data of the edge detection to the processor 202, and the processor 202 is operable to further perform processes to perform calibration based on the status and response data of the edge detection.

Figure 5:
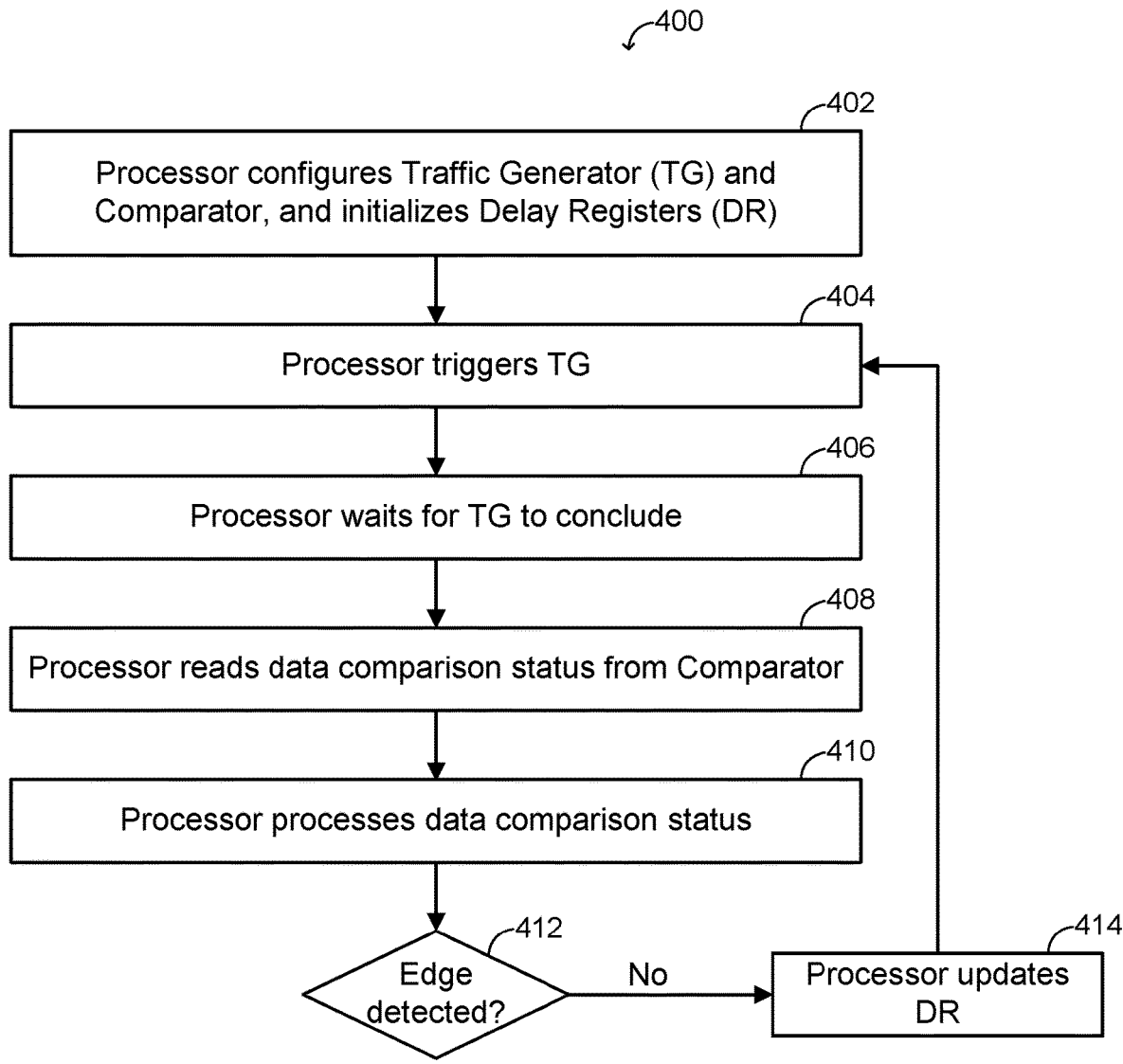
FIG. 5 is another method for detecting an edge of a signal, in accordance with some examples of the present disclosure.

The following description is during operation when the EDM 208 and EDS 212 are bypassed. During this operation, communications between the processor 202 and any of the comparator 214, traffic generator 216, and delay registers 218 is via the selector 210 and decoder 206. This operation is further described in the context of the method 400 of FIG. 5.

In operation 402, the processor 202, via the decoder 206, configures the traffic generator 216, and comparator 214, and initializes the delay registers 218, similar to described above with respect to operation 302 in FIG. 4. In operation 404, the processor 202, via the decoder 206, triggers the traffic generator 216 to begin generating traffic. In operation 406, the processor 202 waits for the traffic generator 216 to conclude. The traffic generator 216 communicates a status signal to the processor 202 that indicates whether the traffic generator 216 is continuing to generate traffic or has concluded.

Upon the traffic generator 216 communicating a status signal to the processor 202 indicating that the traffic generator 216 has concluded generating traffic, in operation 408, the processor 202 reads a comparison status from the comparator 214. As described previously, data is read from memory 114 and is compared, by the comparator 214, to an expected or known pattern. A comparison status is communicated from the comparator 214 to the processor 202 based on the comparison. In operation 410, the processor 202 processes the comparison status, and based on the comparison status, the processor 202 is capable of detecting an edge of a signal.

In operation 412, based on the comparison status, the processor 202 determines whether an edge has been detected. If not, in operation 414, the processor 202 updates one or more of the delay registers 218, which can alter one or more values stored in the delay registers 218 to, e.g., increment a delay of one or more signals in the DCA path 220. The values stored in the delay registers 218 are communicated to the DCA path 220, which controls various delays in signals based on the values. The processor 202 can update the delay registers 218 with a coarse delay tuning and/or fine delay tuning. Thereafter, operations 404 through 412 are repeated until an edge is detected. Once an edge has been detected in operation 412, the processor 202 is operable to further perform processes to perform calibration based on the edge detection.

By offloading some processing capabilities from the processor 202 to the hardware logic, e.g., including the EDM 208 and EDS 212, simple, repetitive tasks can be performed by the hardware logic. This can reduce a time for calibration. For example, edge detection using the method 300 of FIG. 4 can be performed in approximately 10 nanoseconds or less (e.g., 5 or 6 ns) per iteration, whereas edge detection using a processor, like in method 400 of FIG. 5, can be performed in approximately 8 microseconds. Additionally, offloading these capabilities from the processor permits parallel processing by the processor 202 and the hardware logic.

Figure 6:
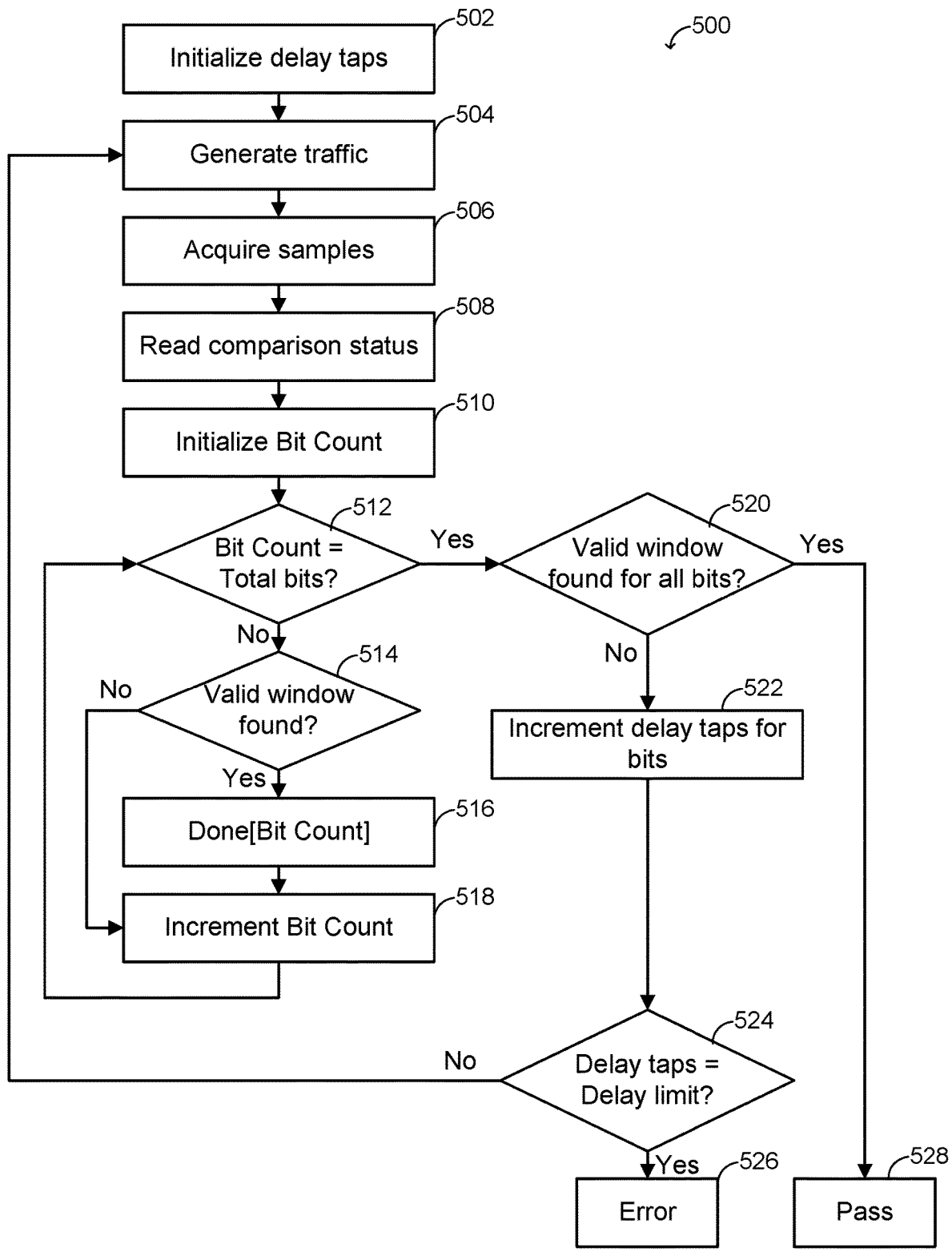
FIG. 6 is a method for detecting edges of signals for multiple bits in a multi-bit signal, in accordance with some examples of the present disclosure.

FIG. 6 is a method 500 for detecting edges using multiple bits in a multi-bit signal, in accordance with some examples of the present disclosure. Depending on calibration stage, such as a write leveling stage, signals that have edges that are detected are based on multiple-bit signals. In other calibration stages, single bit signals may be used to detect an edge. The method 500 permits parallel processing of some operations for the multiple bits of the signal that is used to detect edges.

In operation 502, the delay taps for delay of DCA paths and/or clock paths are initialized, such as to no delay. This can be performed by the processor 202 communicating with the delay registers 218 to configure the delay registers 218 (as in operations 302 and 402). In operation 504, traffic is generated. As previously described, depending on the calibration stage, the traffic that is generated can be read and/or write commands (as in operations 306 and 406). In operation 506, samples are acquired. The samples are the data that is read from memory. The samples may be for each bit of a multi-bit signal in parallel. In operation 508, the comparison status of the comparison by the comparator 214 is read. As described previously, the comparator 214, for each bit, compares the data to an expected or known pattern. A comparison status for each bit is generated based on the comparison.

In operation 510, a bit count, which acts as a loop counter, is initialized, such as to zero. Depending on a mode, the processor 202 or the EDM 208 can maintain the bit count. In operation 512, a determination is made, by the processor 202 or the EDM 208 depending on the mode, whether the bit count equals the total bits of the signal that was sampled. If not, in operation 514, a determination of whether a valid window was found for the bit of the signal corresponding to the bit count is made. Depending on the mode, the processor 202 or the EDS 212 can detect edges of the signal using the bit corresponding to the bit count. The edges that are detected can be used to determine a valid window. In the mode where the EDS 212 is configured to detect the edge, the EDS 212 can communicate a status signal for each bit to the EDM 208 indicating whether an edge has been detected.

If a valid window is found, in operation 516, a done signal for that bit corresponding to the bit count is asserted. If the determination of operation 514 does not determine that a valid window was found and after operation 516, the bit count is incremented, and the method loops to operation 512. Depending on the mode, the processor 202 or the EDM 208 can assert the done signal in operation 516 and can increment the bit count in operation 518. The EDM 208 can assert the done signal in operation 516 based on the status signal for the respective bit received from the EDS 212.

If the bit count equals the total bits in operation 512, a determination of whether a valid window was found for all bits is made in operation 520. This can be performed by determining if the done signal is asserted for all bits. If a valid window has been found for all bits, a pass signal is generated at operation 528, and a next stage can be calibrated or calibration can be concluded. If a valid window has not been found for all bits, delay taps for bits that do not have a corresponding done signal asserted are incremented in operation 522. The delay taps for the bits are, in some examples, incremented in parallel. For example, the done signal for each bit can mask an increment signal, where, without masking, the increment signal would increment delay taps corresponding to all bits in parallel. Then, in operation 524, a determination is made whether the delay taps are equal to a delay limit. If the delay taps equal the delay limit, the taps are saturated, and an error message is generated in operation 526. If the delay taps are not equal to the delay limit, the method loops to operation 504. Operations 520, 522, 524, 526, and 528 are performed, depending on the mode, by the processor 202 or the EDS 212.

In other examples, operations 514 and 516 can be performed by the EDS 212 and/or EDM 208 in parallel for all bits of the signal. Hence in these examples, the looping from operation 518 to operation 512 may be omitted, and the bit count as a loop counter may be omitted. Further, in these examples, follow the performance of operations 514 and/or 516, the method 500 can proceed to the performance of operation 520.

Some examples implementing the example method 500 of FIG. 6 have experienced decreased calibration times and decreased simulation times. For example, calibration times for systems implementing the method 500 were approximately one-fourth of calibration times for systems implementing methods having sequential, serial processing. Also, simulation times for simulating the method 500 for different communication protocols was reduced from about 1 week to about 3 days.

While the foregoing is directed to specific examples, other and further examples may be devised without departing from the basic scope thereof, and the scope thereof is determined by the claims that follow.

What is claimed is:

1. An integrated circuit comprising:
    a traffic generator configurable based on a calibration stage;
    a memory communication path communicatively coupled to the traffic generator, the memory communication path further being configured to be communicatively coupled to memory, the traffic generator being operable to generate commands to the memory via the memory communication path;
    a comparator communicatively coupled to the memory communication path, the comparator being configurable based on the calibration stage, the comparator being operable to compare data from the memory communication path with known data and to responsively output a comparison status, the data from the memory communication path being in response to the commands generated by the traffic generator; and edge detection hardware logic communicatively coupled to the traffic generator and the comparator, the edge detection hardware logic being configurable based on the calibration stage, the edge detection hardware logic being operable to detect an edge of a signal based on the comparison status.

2. The integrated circuit of claim 1, wherein the edge detection hardware logic comprises:
an edge detection slave circuit configurable based on the calibration stage, the edge detection slave circuit being operable to detect the edge of the signal based on the comparison status, the edge detection slave circuit further being operable to generate an edge status indicating whether the edge of the signal has been detected; and
an edge detection master circuit configurable based on the calibration stage, the edge detection master circuit being operable to alter a value of a delay register when the edge status indicates that the edge of the signal has not been detected.

3. The integrated circuit of claim 2, wherein the edge detection hardware logic further comprises a selector circuit configurable based on a detection mode, the selector circuit being configured to bypass the edge detection slave circuit and the edge detection master circuit when the detection mode indicates that a processor is to detect the edge of the signal, the selector circuit transmitting the comparison status to the processor when the detection mode indicates that the processor is to detect the edge of the signal.

4. The integrated circuit of claim 2 further comprising a processor, wherein the edge detection master circuit is further operable to transmit an interrupt status to the processor when the edge status indicates that the edge of the signal has been detected.

5. The integrated circuit of claim 2, wherein a delay of a signal path in the memory communication path is configurable based on the value stored in the delay register, the signal path being a path of the signal.

6. The integrated circuit of claim 2, wherein the edge detection master circuit is further operable to trigger the traffic generator to generate traffic and to enable the edge detection slave circuit to detect the edge of the signal based on the comparison status.

7. The integrated circuit of claim 1 further comprising a processor, the processor being operable to configure the traffic generator, the comparator, and the edge detection hardware logic based on the calibration stage.

8. The integrated circuit of claim 1 further comprising a processor, wherein the edge detection hardware logic is further operable to:
transmit a detection status to the processor when the edge of the signal has been detected; and
alter a value of a delay register when the edge of the signal has not been detected, a delay of a signal path in the memory communication path being configurable based on the value stored in the delay register.

9. A method of operating an integrated circuit, the method comprising:
triggering, by edge detection hardware logic, a traffic generator to generate traffic to memory through a memory communication path;
comparing, by a comparator, a response from the memory to an expected pattern, the response from the memory being based on the traffic; and
detecting, by the edge detection hardware logic, an edge in a signal based on comparing the response to the expected pattern.

10. The method of claim 9 further comprising configuring, by a processor, the edge detection hardware logic, the comparator, and the traffic generator based on a calibration stage.

11. The method of claim 10, wherein configuring, by the processor, includes:
decoding, by a decoder, one or more commands from the processor; and
transmitting, from the decoder, configuration data to the edge detection hardware logic, the comparator, and the traffic generator based on the one or more commands.

12. The method of claim 9 further comprising selectively configuring a selector of the edge detection hardware logic to enable the edge detection hardware logic to trigger the traffic generator and to detect the edge in the signal.

13. The method of claim 9 further comprising:
altering, by the edge detection hardware logic, a value of a delay register when the edge detection hardware logic does not detect the edge in the response, a delay of a signal path in the memory communication path being configurable based on the value stored in the delay register; and
transmitting, by the edge detection hardware logic, a status signal to a processor when the edge detection hardware logic detects the edge.

14. The method of claim 13, wherein:
the edge detection hardware logic comprises an edge detection slave unit and an edge detection master unit;
the edge detection slave unit detecting the edge in the signal based on comparing the response to the expected pattern and generating a detection status based on the detection of the edge; and
the edge detection master unit altering the value of the delay register and transmitting the status signal based on the detection status.

15. The method of claim 9, wherein comparing the response to the expected pattern corresponds with multiple parallel bits of the signal and is performed in parallel for the multiple parallel bits, and detecting the edge of the signal is performed in parallel for the multiple parallel bits.

16. A method of operating an integrated circuit, the method comprising:
using a processor, configuring a traffic generator, a comparator, an edge detection master hardware unit, and an edge detection slave hardware unit based on a calibration stage;
by the edge detection master hardware unit, triggering the traffic generator to generate traffic to memory through a memory communication path, generating the traffic being based on the calibration stage, generating the traffic including reading a response from the memory through the memory communication path;
by the comparator, comparing the response to an expected pattern to generate a comparison status, comparing the response to the expected pattern being based on the calibration stage;
by the edge detection slave hardware unit, generating a detection status based on detection of an edge of a signal based on the comparison status, detection of the edge being based on the calibration stage; and
by the edge detection master hardware unit:
transmitting an interrupt signal to the processor when the detection status indicates the edge has been detected; and
altering a value of a delay register when the detection status indicates the edge has not been detected, a delay of a signal path in the memory communication path being configurable based on the value of the delay register.

17. The method of claim 16 further comprising, using the processor, initializing the value of the delay register.

18. The method of claim 16 further comprising selectively enabling the edge detection master hardware unit and the edge detection slave hardware unit.

19. The method of claim 16, wherein:
comparing the response to the expected pattern corresponds with multiple parallel bits of the signal and is performed in parallel for the multiple parallel bits;
generating the detection status based on detection of the edge of the signal is performed in parallel for the multiple parallel bits; and
altering the value of the delay register is performed in parallel for the multiple parallel bits.

20. The method of claim 16, wherein configuring, using the processor, includes:
decoding, by a decoder, one or more commands from the processor; and transmitting, from the decoder, configuration data to the traffic generator, the comparator, the edge detection master hardware unit, and the edge detection slave hardware unit based on the one or more commands.

* * * * *